(12) United States Patent
Smal et al.

(10) Patent No.: US 12,007,701 B2
(45) Date of Patent: Jun. 11, 2024

(54) DETERMINING A MARK LAYOUT ACROSS A PATTERNING DEVICE OR SUBSTRATE

(71) Applicant: ASML NETHERLANDS B.V., Veldhoven (NL)

(72) Inventors: Pavel Smal, Eindhoven (NL); Inez Marlena Sochal, Tilburg (NL); Gautam Sarma, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 496 days.

(21) Appl. No.: 17/294,503

(22) PCT Filed: Oct. 21, 2019

(86) PCT No.: PCT/EP2019/078529
§ 371 (c)(1),
(2) Date: May 17, 2021

(87) PCT Pub. No.: WO2020/108861
PCT Pub. Date: Jun. 4, 2020

(65) Prior Publication Data
US 2022/0011683 A1     Jan. 13, 2022

(30) Foreign Application Priority Data

Nov. 26, 2018 (EP) ..................................... 18208217
Apr. 29, 2019 (EP) ..................................... 19171485

(51) Int. Cl.
G03F 9/00     (2006.01)
G03F 7/00     (2006.01)

(52) U.S. Cl.
CPC ........ *G03F 9/7046* (2013.01); *G03F 7/70625* (2013.01); *G03F 7/70633* (2013.01); *G03F 7/70683* (2013.01)

(58) Field of Classification Search
None
See application file for complete search history.

(56) References Cited

U.S. PATENT DOCUMENTS

| | | |
|---|---|---|
| 10,095,131 B2 | 10/2018 | Kramer et al. |
| 10,474,045 B2 | 11/2019 | Bijnen et al. |

(Continued)

FOREIGN PATENT DOCUMENTS

| | | |
|---|---|---|
| CN | 1458667 | 11/2003 |
| CN | 1641484 | 7/2005 |

(Continued)

OTHER PUBLICATIONS

International Search Report and Written Opinion issued in corresponding PCT Patent Application No. PCT/EP2019/078529, dated Feb. 21, 2020.

(Continued)

*Primary Examiner* — Hsien Ming Lee
(74) *Attorney, Agent, or Firm* — Pillsbury Winthrop Shaw Pittman, LLP

(57) ABSTRACT

A method for determining a layout of mark positions across a patterning device or substrate, the method including: obtaining a model configured to model data associated with measurements performed on the patterning device or substrate at one or more mark positions; obtaining an initial mark layout including initial mark positions; reducing the initial mark layout by removal of one or more mark positions to obtain a plurality of reduced mark layouts, each reduced mark layout obtained by removal of a different mark position from the initial mark layout; determining a model uncertainty metric associated with usage of the model for each reduced mark layout out of the plurality of reduced mark layouts; and selecting one or more reduced mark layouts based on its associated model uncertainty metric.

20 Claims, 6 Drawing Sheets

(56) References Cited

U.S. PATENT DOCUMENTS

| | | | |
|---|---|---|---|
| 2005/0146721 | A1 | 7/2005 | Consolini et al. |
| 2015/0330777 | A1 | 11/2015 | Blaesing-Bangert |
| 2017/0160073 | A1 | 6/2017 | Elings et al. |
| 2018/0067900 | A1 | 3/2018 | Mos et al. |
| 2018/0314168 | A1 | 11/2018 | Van Haren et al. |
| 2019/0243252 | A1* | 8/2019 | Frisco ................. G03F 7/70616 |

FOREIGN PATENT DOCUMENTS

| | | |
|---|---|---|
| CN | 104992184 | 10/2015 |
| CN | 106462089 | 2/2017 |
| CN | 107850862 | 3/2018 |
| EP | 3309617 | 4/2018 |
| TW | I374248 | 10/2012 |
| WO | 2018069015 | 4/2018 |

OTHER PUBLICATIONS

Taiwanese Notice of Allowance issued in corresponding Taiwanese Patent Application No. 108140200, dated Jul. 20, 2020.
European Search Report issued in corresponding European Patent Application No. EP19171485, dated Oct. 25, 2019.
Office Action issued in corresponding Chinese Patent Application No. 201980076671.7, dated Nov. 17, 2023.

* cited by examiner

DETERMINING A MARK LAYOUT ACROSS A PATTERNING DEVICE OR SUBSTRATE

CROSS-REFERENCED TO RELATED APPLICATIONS

This application is the U.S. national phase entry of PCT Patent Application No. PCT/EP2019/078529 which was filed on Oct. 21, 2019, which claims the benefit of priority of European Patent Application No. 18208217.2 which was filed on Nov. 26, 2018 and of European Patent Application No. 19171485.6 which was filed on Apr. 29, 2019, each of which is incorporated herein in its entirety by reference.

FIELD

The present invention relates to a method for determining a layout of mark positions across a patterning device or substrate, an associated apparatus and a computer program.

BACKGROUND

A lithographic apparatus is a machine applying a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Another challenge for lithographic apparatuses is to expose all patterns on the substrate with sufficient focus uniformity. This is important so that the yield across the substrate does not suffer from de-focus failures, apart from at the very edge of the substrate. A printed image on the substrate has sufficient contrast only in a limited (vertical) range around a best focus of exposure. Out-of-focus exposure can cause not only reduced contrast but, in some cases, change in the critical dimensions of the patterns. Imperfections in semiconductor processing equipment and processing (e.g., lithography, etch, bake, polish and anneal) can introduce imperfections across a substrate. A pattern of imperfections is known as a process fingerprint. Such imperfections result in process distortions which can cause overlay or focus errors. It is normal to characterize the process fingerprints directly in terms of correctable parameters of the lithographic apparatus.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor integrated circuits or other products.

A process fingerprint such as a focus or overlay fingerprint is determined by placing and measuring features at locations on the substrate.

As pattern features become smaller and overlay performance requirements become ever more demanding, so-called advanced alignment models and focus models have been and continue to be developed to model and correct more accurately distortions of the "wafer grid". These advanced models depend on measuring an increased number of target features across the substrate. Ultimately, however only a limited number of the available target features can be measured without unduly limiting the throughput of the lithographic process as a whole. Focus variations across the substrate have a high frequency of occurrence, which requires a certain number of target features per exposure image to be placed and measured, in order to capture the focus fingerprint with sufficient accuracy.

Selecting the optimal set of locations on a substrate for measurements or placing features can improve the accuracy of determining process fingerprints.

A cross-wafer sampling algorithm, or sample scheme optimizer (SSO), may be used to select the optimal set of locations on a substrate for measurements. The sampling algorithm determines the fingerprint of for example overlay or substrate deformations across the substrate. The constraints are that locations need to be distributed with sufficient density, while being distributed across the entire substrate. Open areas should be avoided. The number of sample points should be limited to reduce the impact on measurement time. The sampling algorithm should be fast enough to be practical in a production environment.

A field sampling algorithm, or mark-layout optimizer, may be used to select the optimal set of locations on a substrate for placing target features. The field sampling algorithm has other requirements. It needs to facilitate the determination of a field-specific fingerprint, for example focus, overlay or alignment. The constraints are the allowed marks locations, the maximum number of marks, etc.

To reduce measurement time, a semiconductor manufacturer may choose to use only subset of overlay marks (existing on reticle) for alignment and focus modeling. However, reducing the number of measurements affects overlay negatively. Nevertheless, in certain situations this is acceptable as it offers an increase in throughput, because of the decrease in metrology time. In such an approach, choosing a sub-layout that has the smallest effect on overlay (smallest error propagation) is crucial. This is a combinatorial optimization problem.

A brute-force exhaustive search may be used to solve the problem. However, an exhaustive search is computationally very demanding and therefore cannot be used in most practical situations. Conventional SSO-like algorithms cannot find the global optimum, though they provide good approximation to the optimum and are more computationally efficient. But such conventional approaches are still computationally demanding.

SUMMARY

The inventors have found a method which is able efficiently to achieve optimal selection of a mark layout comprising positions of marks on a patterning device or substrate for alignment, focus, overlay or critical dimension (CD) measurement.

According to a first aspect of the present invention, there is provided a method for determining a layout of mark positions across a patterning device or substrate, the method comprising: a) obtaining a model configured to model data associated with measurements performed on the patterning device or substrate at one or more mark positions; b) obtaining an initial mark layout comprising initial mark positions; c) reducing the initial mark layout by removal of one or more mark positions to obtain a plurality of reduced mark layouts, each reduced mark layout obtained by removal of a different mark position from the initial mark layout; d) determining a model uncertainty metric associated with usage of the model for each reduced mark layout out of said plurality of reduced mark layouts; and e) selecting one or more reduced mark layouts based on its associated model uncertainty metric.

According to a second aspect of the present invention, there is provided a computer program comprising computer readable instructions which, when run on suitable computer apparatus, cause the computer apparatus to perform the method of the first aspect.

According to a third aspect of the present invention, there is provided a computer program product comprising the computer program of the second aspect.

According to a fourth aspect of the present invention, there is provided an apparatus specifically adapted to carry out the steps of the method according to the first aspect. The apparatus may be configured as a lithographic apparatus operable to perform a lithographic process on said substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
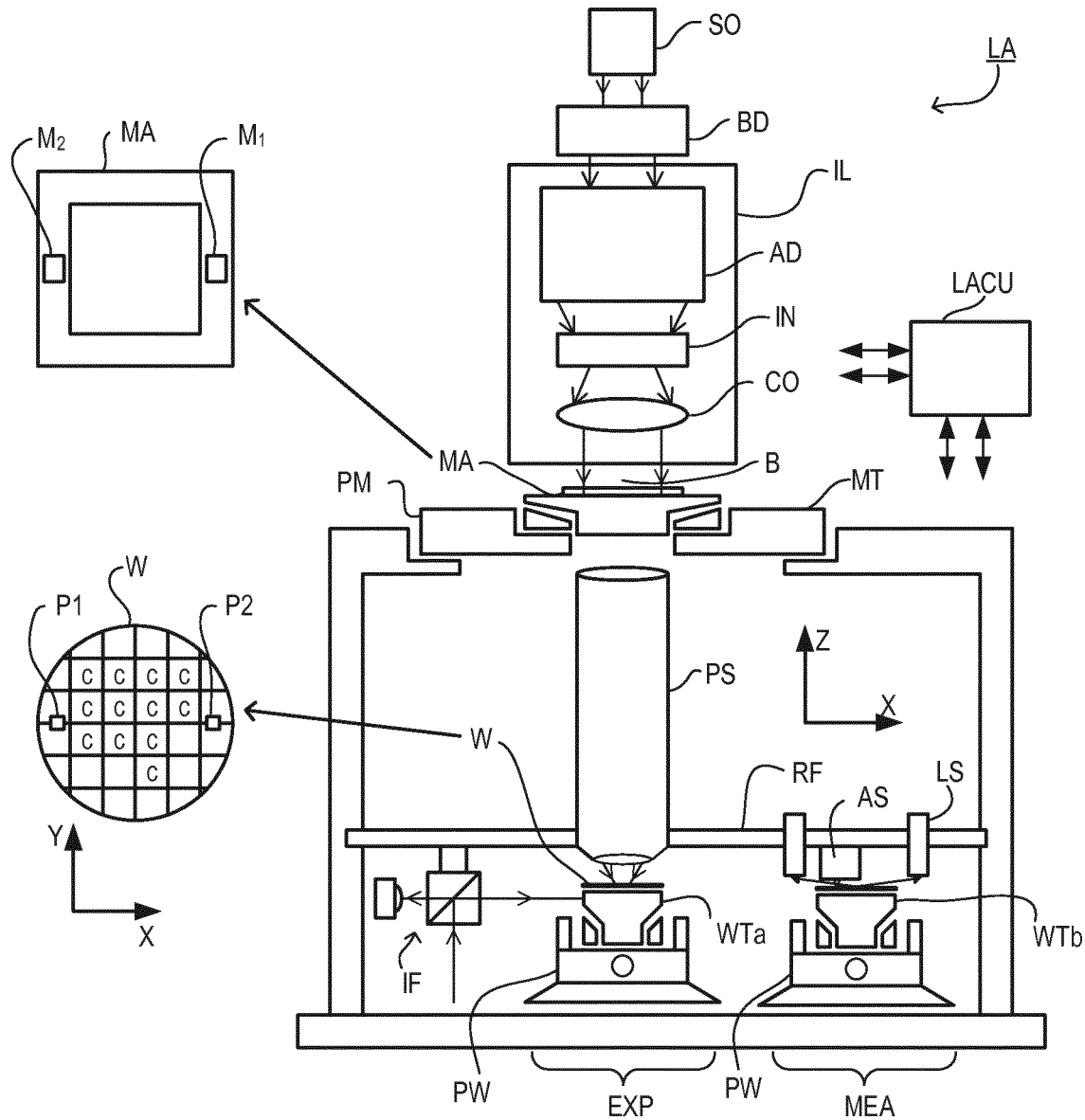
FIG. 1 depicts a lithographic apparatus according to an embodiment of the invention.

FIG. 1 schematically depicts a lithographic apparatus LA, which may be used to implement an embodiment of the invention. The apparatus comprises:

i. an illumination system (illuminator) IL configured to condition a radiation beam B (e.g. UV radiation or EUV radiation).

ii. a support structure (e.g. a mask table) MT constructed to support a patterning device (e.g. a mask) MA and connected to a first positioner PM configured to accurately position the patterning device in accordance with certain parameters;

iii. a substrate table (e.g. a wafer table) WTa or WTb constructed to hold a substrate (e.g. a resist coated wafer) W and connected to a second positioner PW configured to accurately position the substrate in accordance with certain parameters; and iv. a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as -outer and -inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
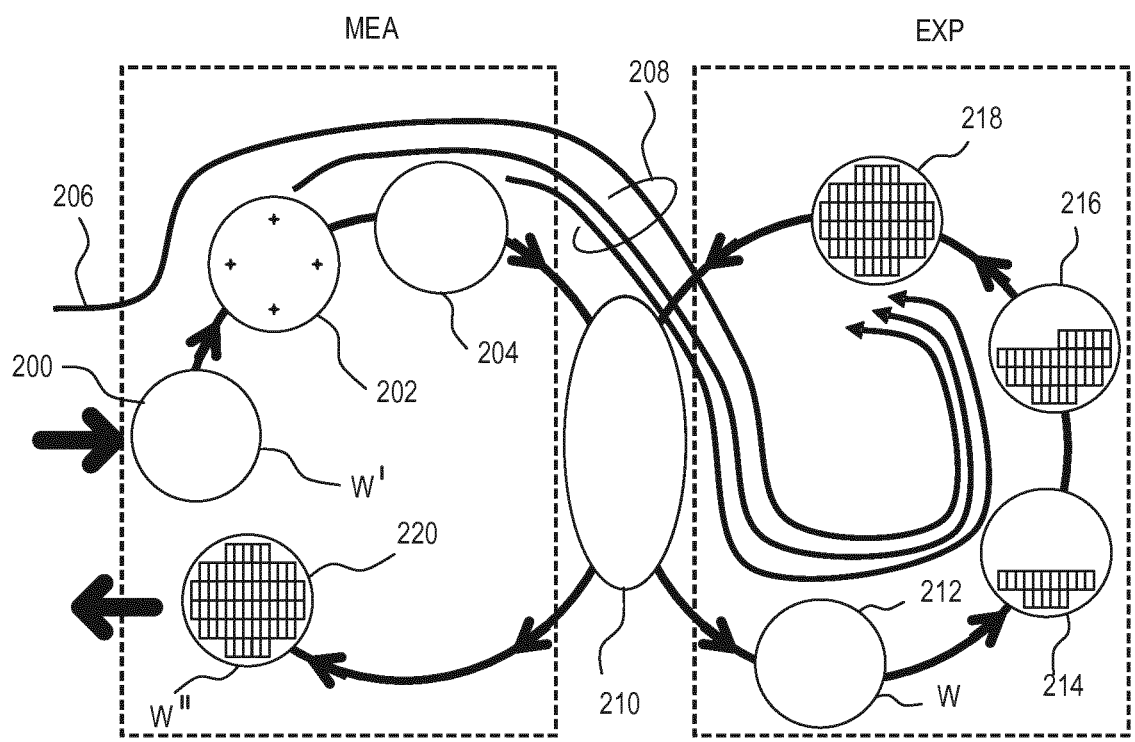
FIG. 2 illustrates schematically the stages in the measurement and exposure processes in the apparatus of FIG. 1.

FIG. 2 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In FIG. 2, at 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of substrate height against X-Y position is measured also, for use in accurate focusing of the exposed pattern.

When substrate W' was loaded, recipe data 206 were received, defining the exposures to be performed, and also properties of the substrate and the patterns previously made and to be made upon it. To these recipe data are added the measurements of substrate position, substrate grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, substrates W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W'' is unloaded from the apparatus at step 220, to undergo etching or other processes, in accordance with the exposed pattern.

Selecting the optimal set of locations for measurements or features is an optimization problem.

Figure 3:
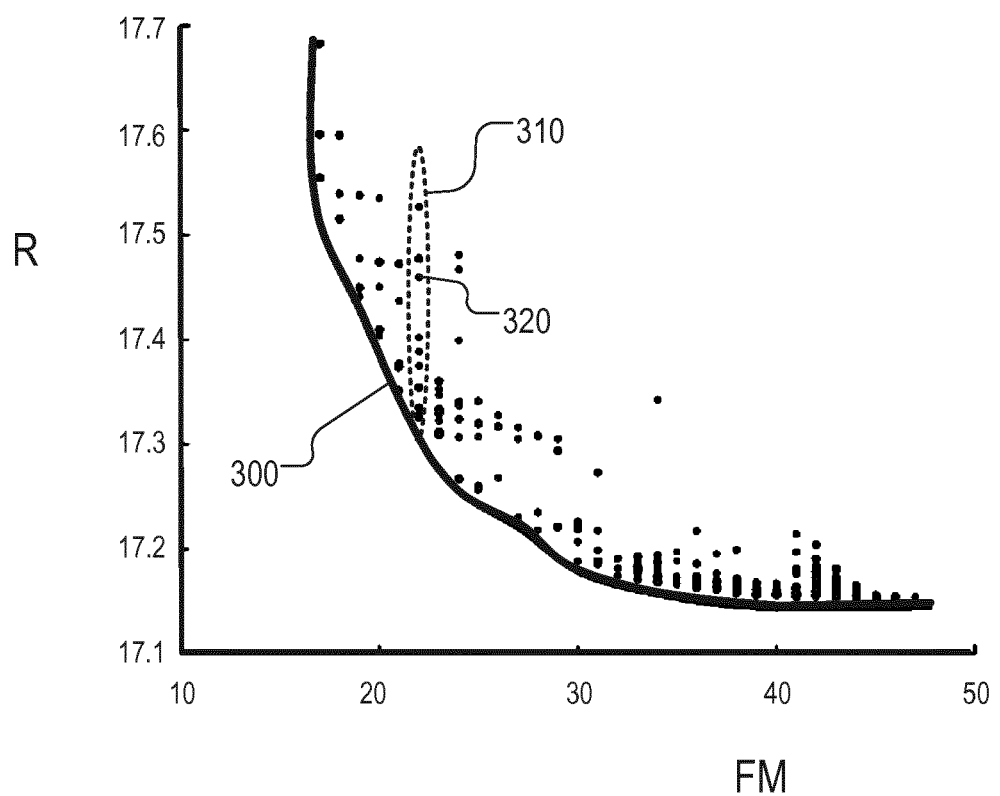
FIG. 3 illustrates the concept of the use of a Pareto front according to an embodiment of the invention.

FIG. 3 illustrates an example of the use of a Pareto front representation of a multi-objective problem. A Pareto front is defined as a relation between objectives (e.g. to be optimized parameters) associated with a multi-objective optimization problem. The Pareto front 300 of FIG. 3 demonstrates the relation between a first objective of maximizing focus correction potential on the y-axis (minimum achievable residue, R, of focus errors after correction) and a second objective of using a minimal amount of focus markers (or focus measurements), FM, on the x-axis. The Pareto front may be established by calculation of a plurality of configurations (e.g. candidate solutions) and determine for each configuration a measure of the objectives (e.g. a focus correction residue and a number of markers used to achieve this). In FIG. 3 each dot 320 represents a certain configuration (distribution) of the focus markers (measurements) across the substrate and the residual after correction when this configuration is applied. It is clear from the figure that certain configurations are better suitable for determining a focus correction using a certain number of focus markers than other configurations. This is further illustrated by the selection 310 of a set of focus marker configurations, given a constant number of markers. The Pareto front 300 may be approximated by fitting a curve at the lower end of the distributions 310 (e.g. lowest residual focus error as a function of the number of markers).

In an example, solving of the multi-objective problem using any of the methods disclosed in European Patent publication EP3309617A1 (Evolutionary Algorithm, Genetic Algorithm, Evolutionary Algorithm for Scheme Optimization, Simulated Annealing, tabu search) includes determination of a Pareto front, wherein the Pareto front establishes a relation between a first objective and a second objective. EP3309617A1 is hereby incorporated by reference in its entirety. In the example of FIG. 3, the first objective is a focus error residue after focus correction and the second objective is minimization of the number of utilized focus markers and/or the number of focus measurements performed on the focus markers. The Pareto front may however be determined to establish the relation between any suitable first objective and second objective, for example, but not limited to, the first objective may be associated with any of: an overlay error residue, a dose error residue, a Critical Dimension error residue, the second objective may be associated with any of: a number of markers used, a number of measurements performed.

FIG. 3 demonstrates a one-dimensional Pareto Front, establishing a relation between two objectives. In general, the concept of the Pareto Front is however not limited to a one-dimensional representation, a Pareto Front may indicate the relation between three or more objectives associated with a multi-objective problem. In such a case the Pareto Front may be a surface in two or more dimensions.

The use of Genetic Algorithms to determine a preferred layout of mark positions or measurements positions (for measurements performed on a patterning device or substrates provided with marks) is an effective way to arrive at an efficient mark layout in view of either not providing too many metrology structures (marks) to a patterning device and/or not to measure an unduly large number of marks (costing metrology time, potentially affecting throughput of the process in a negative fashion).

An alternative method to derive an efficient mark layout is proposed herein. The core idea of the method is to start with an initial mark layout and gradually remove the number of marks (positions) from the mark layout while monitoring the model uncertainty. The model uncertainty is typically defined as the relative propagation of measurement error to a modelling (e.g. fitting) error when applying the model to the measurements. A more elaborate explanation of model uncertainty, and more specifically normalized model uncertainty (nMU) (commonly referred to as a G-optimality criterion) is given in paragraph [0170] of US patent application publication US2018/0067900, which patent application is hereby incorporated by reference in its entirety. The removal of a mark (position) from an initial mark layout comprising N mark positions is not unique; basically, there are N ways (e.g. N reduced mark layouts) which all meet the criterion that the total number of marks (positions) is N–1.

For each of the set of reduced mark layouts the model uncertainty is calculated and only the reduced mark layouts for which the model uncertainty metric meets a certain criterion (e.g. is below a threshold) are selected.

Figure 4:
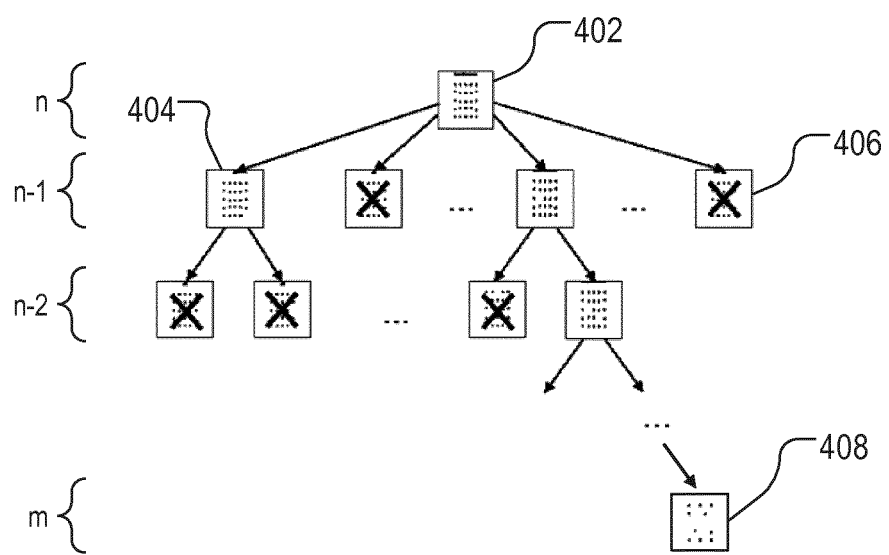
FIG. 4 illustrates a method of determining a layout of marks according to an embodiment of the invention.

Each selected reduced mark layout can then be further reduced by repeating the described method until either a desired number of marks (positions) has been reached or it is found that no reduced mark layout meets the required model uncertainty. The method of mark layout reduction is depicted in FIG. 4. The initial mark layout 402 comprises 'n' marks (top of tree depicted in FIG. 4). The first n–1 reduced mark layouts are depicted as the first row of layout below the initial layout. The reduced layouts having an associated model uncertainty exceeding a criterion are depicted as a box with a cross inside, e.g. 406. Only the reduced layouts having acceptable model uncertainties are further reduced (for example the reduced layout 404 having n–1 marks at the left position of FIG. 4). The algorithm as depicted in FIG. 4 may continue until an optimum layout 408 having 'm' marks is found that has an associated acceptable model uncertainty and an acceptable number of marks 'm' (e.g. m; being not too large to involve a too large metrology effort).

The described method is often referred to as a 'Branch-Cutting' algorithm; only viable branches are evaluated which may save an enormous amount of calculation time as each model uncertainty calculation may be very computationally extensive.

It can also be decided that for each branch only the reduced mark layout is selected that has the most optimum (e.g. lowest) model uncertainty and reducing the mark layout follows a simple straight path. This method is often referred to as a 'Greedy Search' method.

Also, a hybrid method of using the greedy search and the branch-cutting method may be adopted. The Greedy Search method is used to have a quick estimate of the minimum amount of mark positions needed for having an acceptable model uncertainty and/or a threshold of the model uncertainty. The Branch-Cutting method is then terminated in dependence of the result of the Greedy Search (e.g. either or both of a minimum amount of mark positions and an estimated threshold of the model uncertainty).

Figure 5:
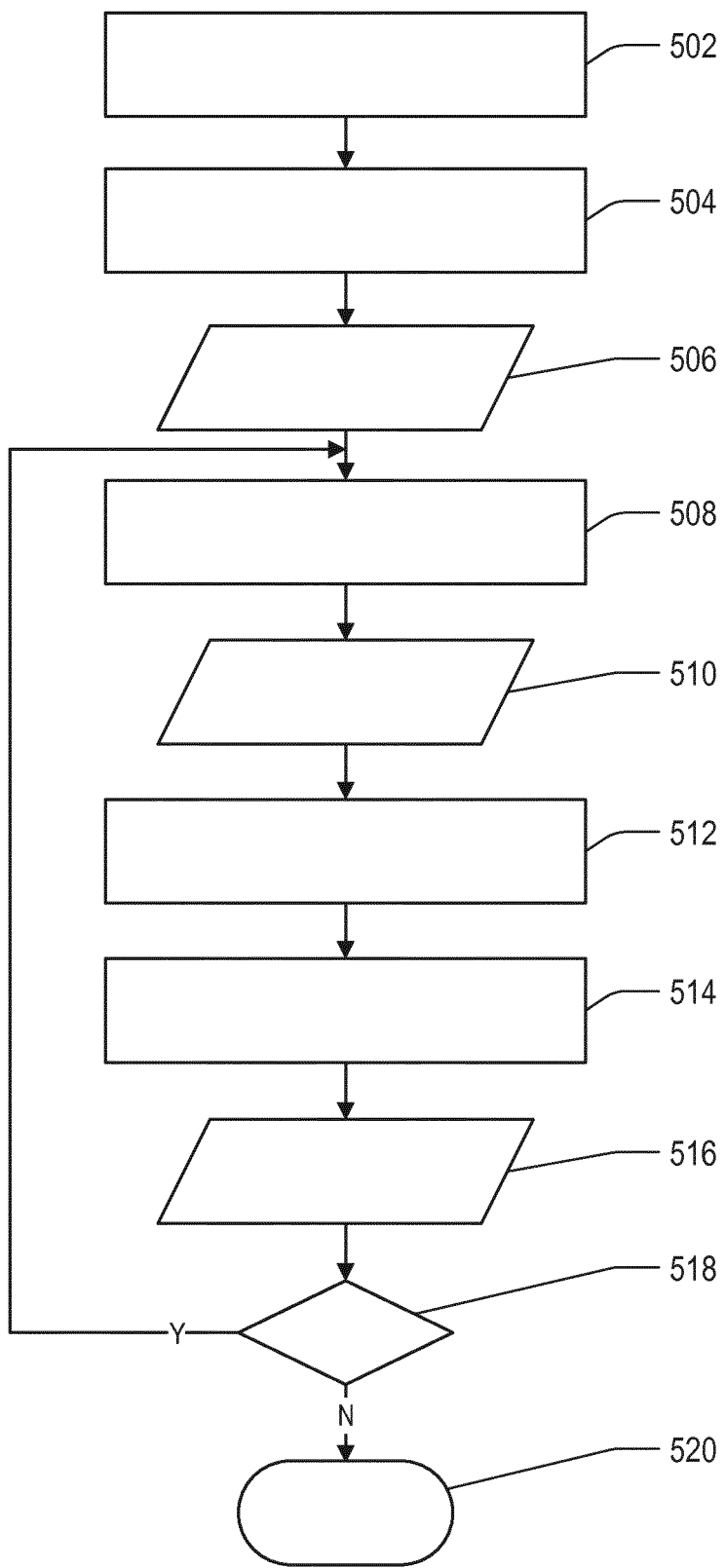
FIG. 5 is a flowchart illustrating a method according to an embodiment of the invention.

FIG. 5 is a flowchart illustrating a method according to an embodiment of the invention. With reference to FIG. 5, in an embodiment a method for determining a layout of mark positions across a patterning device or substrate is described.

The method comprises: a) obtaining 502 a model configured to model data associated with measurements performed on the patterning device or substrate at one or more mark positions; b) obtaining 504 an initial mark layout 506 comprising initial mark positions; c) reducing 508 the initial mark layout by removal of one or more mark positions to obtain a plurality of reduced mark layouts 510, each reduced mark layout obtained by removal of a different mark position from the initial mark layout; d) determining 512 a model uncertainty metric associated with usage of the model for each reduced mark layout out of said plurality of reduced mark layouts; and e) selecting 514 one or more reduced mark layouts 516 based on the model uncertainty metric associated with the plurality of reduced mark layouts.

Further examples of the method are disclosed in the embodiments as disclosed in the next paragraphs.

In an embodiment, the reduced mark layout 516 is selected which has the lowest model uncertainty metric.

In an embodiment, the method comprises reducing the selected one or more reduced mark layouts by applying steps c) 508, d) 512 and e) 514 to each of the selected reduced mark layouts 516, instead of applying said steps to the initial mark layout 506.

In an embodiment, the mark layout is a layout of one or more of: alignment mark positions, overlay mark positions, focus mark positions or critical dimension (CD) mark positions.

In an embodiment, the model is a six-parameter model describing alignment parameters of a substrate, the substrate being a wafer.

In an embodiment, the model uncertainty metric is a normalized model uncertainty, commonly referred to as a G-optimality criterion.

In an embodiment, the mark positions are distributed across a field on a substrate.

In an embodiment, the mark positions are distributed across an entire substrate.

In an embodiment, the steps c) 508, d) 512 and e) 514 are repeated until 518 the reduced mark layout comprises a pre-defined number of mark positions.

In an embodiment, the pre-defined number of mark positions is based on an acceptable measurement time associated with measuring said number of mark positions.

In an embodiment, the method comprises applying steps c) 508, d) 512 and e) 514 to the selected reduced mark layout 516 until 518 the model uncertainty metric exceeds a threshold.

In an embodiment, the pre-defined number of mark positions is based on the model uncertainty.

Given a field layout with n marks, embodiments find a sub-layout with m marks (m<n) that has the smallest possible normalized model uncertainty (nMU) metric.

The generalized problem is: given field layout with n marks, and desired number of marks m (m<n) find sub-layouts with k marks (k=n−1, ..., m) that has the smallest possible nMU metric for each k.

The nMU metric may be defined as $$RMS\left\{\max_{x,y} nMU_x(x,y), \max_{x,y} nMU_y(x,y)\right\}$$

though other variants of nMU based metrics may be used. $nMU_{x,y}(x,y)$ is model dependent. For example, a six-parameter or an eighteen-parameter model describing alignment or overlay parameters of a substrate may be used for high-order corrections per exposure (CPE).

We aim at solving the generalized problem with relatively small number of marks (n<50) which is often found in semiconductor manufacturer's environment. In tests, the problem was solved for n=25, m=10, and showed substantial speed-up compared to an exhaustive search.

The general idea of the method is based on the observation that removing a mark from a layout makes nMU bigger. In other words: $L_2 \subset L_1 \Rightarrow nMU(L_2) \geq nMU(L_1)$.

Following on from that, given a layout L with too big nMU: nMU(L)>T (where T is a certain threshold), all its sublayouts are excluded from consideration. This branch-cutting approach drastically reduces number of layouts that need to be evaluated to find global minimum.

The algorithm may consist of two parts. First, we find a proper threshold T, and then execute branch cut optimization.

The first part is finding the threshold T with a Greedy Search, which has the following steps:
1. Start with full layout ($L_{full}$). Initialize L: =$L_{full}$, k:=n
2. Find best layout with k−1 marks $L_{k-1}$. Assign L:=$L_{k-1}$, k:=k−1.
3. If k>m, repeat Step 2.
4. T:=nMU(L)

The aim is to find a layout with m marks and relatively small nMU. Alternatively, a conventional SSO-like algorithm can be used for this purpose. In different approaches, thresholds for all k could be remembered and used afterwards.

The second part of the algorithm is Branch-Cut optimization, which has the following steps:
1. Initialize lattice of layouts: Layouts$_{n-1}$={set of layouts with n−1 marks}, ..., Layouts$_m$={set of $C_n^m$ layouts with m marks}; Initialize k: =n−1
2. Evaluate all active layouts L ∈ Layouts$_k$ with k marks. This step corresponds to steps 508 and 512 described above with respect to FIG. 5.
3. For all L∈Layouts$_k$ with nMU(L)>T, invalidate its sublayouts:
   Layouts$_q$:=Layouts$_q$ \SubLayouts$_q$(L) for all q=k−1, ..., m. Here SubLayouts$_q$(L) is the set of all sublayouts of layout L with q marks. This step corresponds to step 514 described with respect to FIG. 5.
4. If k>m, set k:=k−1. Repeat Step 2. This step corresponds to step 518 described with respect to FIG. 5.
5. For all k=n−1, ..., m all active (not invalidated) layouts Layouts$_k$ are already evaluated. Due to the choice of threshold T, Layouts$_k$ are not empty and contain layout with global optimal nMU. Choose layout with smallest nMU for every k.

Steps 2 and 3 are easily parallelizable.

Branch cutting drastically decreases number of layouts that need to be evaluated comparing to brut force (exhaustive search) method, and actually makes such evaluation feasible.

Using the lattice of sublayouts allows embodiments to find optimal layouts for any number of marks from n−1 to m at once, and to reuse evaluation of sub-layouts with k marks while evaluating sub-layouts with k−1 marks.

In an embodiment a computer program comprises computer readable instructions which, when run on suitable computer apparatus, cause the computer apparatus to perform the method of any preceding embodiment.

In an embodiment a computer program product comprised the computer program of the previous embodiment.

In an embodiment an apparatus is specifically adapted to carry out the steps of the method according to any embodiment, the apparatus being configured as a lithographic apparatus operable to perform a lithographic process on said substrate.

Further embodiments of the invention are disclosed in the list of numbered clauses below:
1. A method for determining a layout of mark positions across a patterning device or substrate, the method comprising:
   a) obtaining a model configured to model data associated with measurements performed on the patterning device or substrate at one or more mark positions;
   b) obtaining an initial mark layout comprising initial mark positions;
   c) reducing the initial mark layout by removal of one or more mark positions to obtain a plurality of reduced mark layouts, each reduced mark layout obtained by removal of a different mark position from the initial mark layout;

d) determining a model uncertainty metric associated with usage of the model for each reduced mark layout out of said plurality of reduced mark layouts; and e) selecting one or more reduced mark layouts based on the model uncertainty metric associated with the plurality of reduced mark layouts.

2. The method of clause 1, wherein only the reduced mark layout is selected which has the lowest model uncertainty metric among the plurality of reduced mark layouts.

3. The method of clause 1 or 2, further comprising:

f) obtaining the initial mark layout from a selected reduced mark layout out of the one or more selected reduced mark layouts and repeating step c), d) and e); and g) repeating step f) for all selected one or more reduced mark layouts.

4. The method of clause 3, wherein the steps f) and g) are repeated until the reduced mark layout comprises a pre-defined number of mark positions.

5. The method of clause 4, wherein the pre-defined number of mark positions is based on an acceptable measurement time associated with measuring said number of mark positions.

6. The method of clause 3, wherein the steps f) and g) are repeated until the model uncertainty metric exceeds a threshold.

7. The method of clause 4, wherein the pre-defined number of mark positions is based on the model uncertainty determined by the method of clause 6.

8. The method of any preceding clause, wherein the mark layout is a layout of one or more of: alignment mark positions, overlay mark positions, focus mark positions or Critical-Dimension mark positions.

9. The method of any preceding clause, wherein the model is a six-parameter model describing alignment or overlay parameters of a substrate, the substrate being a wafer.

10. The method of any preceding clause, wherein the model uncertainty metric is associated with a G-optimality criterion.

11. The method of any preceding clause, wherein the mark positions are distributed across a field on a substrate.

12. The method of any of clauses 1 to 10, wherein the mark positions are distributed across an entire substrate.

13. A computer program comprising computer readable instructions which, when run on suitable computer apparatus, cause the computer apparatus to perform the method of any preceding clause.

14. A computer program product comprising the computer program of clause 13.

15. An apparatus specifically adapted to carry out the steps of the method according to any of clauses 1 to 12, the apparatus being configured as a lithographic apparatus operable to perform a lithographic process on said substrate.

Figure 6:
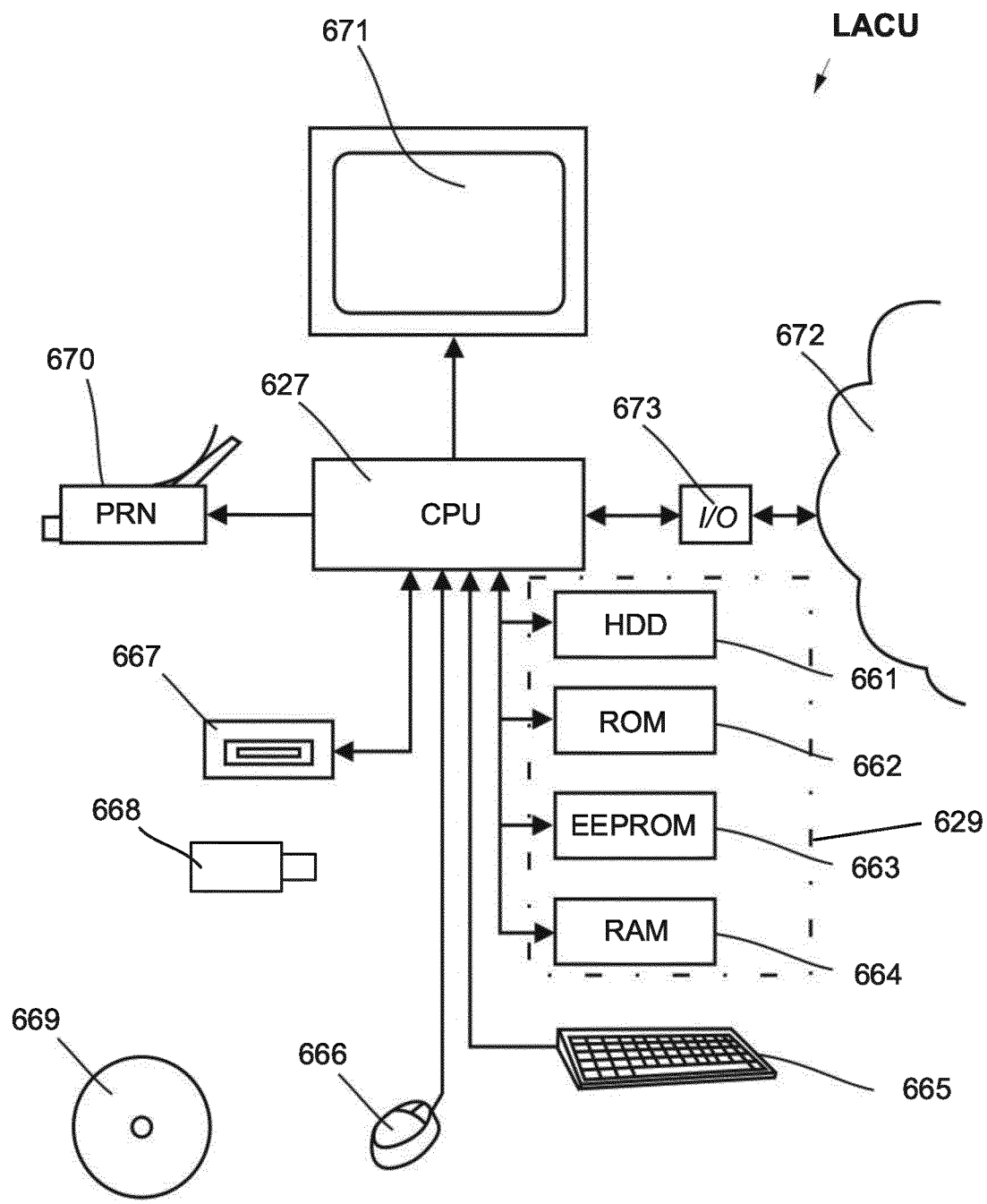
FIG. 6 illustrates computer system hardware useful in implementing the methods disclosed herein.

The steps of the methods described above can be automated within the lithography apparatus control unit LACU shown in FIG. 1. This unit LACU may include a computer assembly as shown in FIG. 6. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 629 connected to processor 627 may comprise a number of memory components like a hard disk 661, Read Only Memory (ROM) 662, Electrically Erasable Programmable Read Only Memory (EEPROM) 663 or Random Access Memory (RAM) 664. Not all aforementioned memory components need to be present. Furthermore, it is not essential that aforementioned memory components are physically in close proximity to the processor 627 or to each other. They may be located at a distance away The processor 627 may also be connected to some kind of user interface, for instance a keyboard 665 or a mouse 666. A touch screen, track ball, speech converter or other interfaces that are known to persons skilled in the art may also be used.

The processor 627 may be connected to a reading unit 667, which is arranged to read data, e.g. in the form of computer executable code, from and under some circumstances store data on a data carrier, like a solid-state drive 668 or a CDROM 669. Also, DVD's or other data carriers known to persons skilled in the art may be used.

The processor 627 may also be connected to a printer 670 to print out output data on paper as well as to a display 671, for instance a monitor or LCD (Liquid Crystal Display), of any other type of display known to a person skilled in the art.

The processor 627 may be connected to a communications network 672, for instance a public switched telephone network (PSTN), a local area network (LAN), a wide area network (WAN) etc. by means of transmitters/receivers 673 responsible for input/output (I/O). The processor 627 may be arranged to communicate with other communication systems via the communications network 672. In an embodiment of the invention external computers (not shown), for instance personal computers of operators, can log into the processor 627 via the communications network 672.

The processor 627 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 627 may even be located a distance away of the other processing units and communicate via communications network 672. Connections between modules can be made wired or wireless.

The computer system can be any signal processing system with analogue and/or digital and/or software technology arranged to perform the functions discussed here.

The term substrate used herein may refer to a wafer or a patterning device such as a reticle. In lithography, a reticle has a pattern which is imaged to a target substrate, such as a wafer.

Although specific reference may be made in this text to the use of lithographic apparatus in the manufacture of ICs, it should be understood that the lithographic apparatus described herein may have other applications, such as the processing of substrates in the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method for determining a layout of mark positions across a patterning device or substrate, the method comprising:
 obtaining a computer model configured to model data associated with measurements performed on the patterning device or substrate at one or more mark positions;
 obtaining an initial mark layout comprising initial mark positions;
 reducing the initial mark layout by removal of one or more mark positions to obtain a plurality of reduced mark layouts, each reduced mark layout obtained by removal of a different mark position from the initial mark layout;
 determining a model uncertainty metric associated with usage of the computer model for each reduced mark layout out of the plurality of reduced mark layouts; and
 selecting one or more reduced mark layouts based on the model uncertainty metric associated with the plurality of reduced mark layouts.

2. The method of claim 1, wherein only the reduced mark layout is selected which has the lowest model uncertainty metric among the plurality of reduced mark layouts.

3. The method of claim 1, further comprising:
 a) obtaining the initial mark layout from a selected reduced mark layout out of the one or more selected reduced mark layouts and repeating the reducing, determining, and selecting; and
 b) repeating step a) for all selected one or more reduced mark layouts.

4. The method of claim 3, wherein the steps a) and b) are repeated until the reduced mark layout comprises a pre-defined number of mark positions.

5. The method of claim 4, wherein the pre-defined number of mark positions is based on an acceptable measurement time associated with measuring the number of mark positions.

6. The method of claim 3, wherein the steps a) and b) are repeated until the model uncertainty metric exceeds a threshold.

7. The method of claim 4, wherein the pre-defined number of mark positions is based on the model uncertainty.

8. The method of claim 1, wherein the initial mark layout or a reduced mark layout of the plurality of reduced mark layouts is a layout of one or more selected from: alignment mark positions, overlay mark positions, focus mark positions or critical dimension mark positions.

9. The method of claim 1, wherein the computer model is a six-parameter model describing an alignment or overlay parameter of a substrate, the substrate being a wafer.

10. The method of claim 1, wherein the model uncertainty metric is associated with a G-optimality criterion.

11. The method of claim 1, wherein the mark positions are distributed across a field on a substrate.

12. The method of claim 1, wherein the mark positions are distributed across an entire substrate.

13. An apparatus specifically configured to carry out the method of claim 1, the apparatus configured as a lithographic apparatus operable to perform a lithographic process on the substrate.

14. A computer program product comprising a non-transitory computer-readable medium having computer readable instructions therein, the instructions, when run on a suitable computer apparatus, configured to cause the computer apparatus to at least:
 obtain a computer model configured to model data associated with measurements performed on a patterning device or substrate at one or more mark positions across the patterning device or substrate;
 obtain an initial mark layout comprising initial mark positions;
 reduce the initial mark layout by removal of one or more mark positions to obtain a plurality of reduced mark layouts, each reduced mark layout obtained by removal of a different mark position from the initial mark layout;

determine a model uncertainty metric associated with usage of the computer model for each reduced mark layout out of the plurality of reduced mark layouts; and select one or more reduced mark layouts based on the model uncertainty metric associated with the plurality of reduced mark layouts.

15. The computer program product of claim 14, wherein only the reduced mark layout is selected which has the lowest model uncertainty metric among the plurality of reduced mark layouts.

16. The computer program product of claim 14, wherein the instructions are further configured to cause the computer apparatus to:
 a) obtain the initial mark layout from a selected reduced mark layout out of the one or more selected reduced mark layouts and repeat the reducing, determining, and selecting; and
 b) repeat a) for all selected one or more reduced mark layouts.

17. The computer program product of claim 14, wherein a) and b) are repeated until the reduced mark layout comprises a pre-defined number of mark positions.

18. The computer program product of claim 14, wherein a) and b) are repeated until the model uncertainty metric exceeds a threshold.

19. The computer program product of claim 14, wherein the initial mark layout or a reduced mark layout of the plurality of reduced mark layouts is a layout of one or more selected from: alignment mark positions, overlay mark positions, focus mark positions or critical dimension mark positions.

20. The computer program product of claim 14, wherein the model uncertainty metric is associated with a G-optimality criterion.

* * * * *